United States Patent
Park et al.

(10) Patent No.: US 10,020,324 B2
(45) Date of Patent: *Jul. 10, 2018

(54) DISPLAY DEVICE

(71) Applicant: LG DISPLAY CO., LTD., Seoul (KR)

(72) Inventors: ChongHun Park, Paju-si (KR); Seung-Yong Yang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/429,017

(22) Filed: Feb. 9, 2017

(65) Prior Publication Data

US 2017/0154898 A1    Jun. 1, 2017

Related U.S. Application Data

(63) Continuation of application No. 14/506,812, filed on Oct. 6, 2014, now Pat. No. 9,608,009.

(30) Foreign Application Priority Data

Oct. 7, 2013  (KR) .................. 10-2013-0119252

(51) Int. Cl.
*H01L 27/12*    (2006.01)
*H01L 29/786*   (2006.01)
(Continued)

(52) U.S. Cl.
CPC .......... *H01L 27/124* (2013.01); *H01L 27/127* (2013.01); *H01L 27/1225* (2013.01);
(Continued)

(58) Field of Classification Search
CPC .................................................. H01L 27/124
See application file for complete search history.

(56) References Cited

U.S. PATENT DOCUMENTS 5,825,449 A    10/1998  Shin
6,067,132 A     5/2000  Kim
(Continued)

FOREIGN PATENT DOCUMENTS

CN    1346153 A    4/2002
CN    1862789 A   11/2006
(Continued)

OTHER PUBLICATIONS

Chinese Office Action dated Dec. 2, 2016 for the related Chinese Patent Application No. 201410513025.8.
(Continued)

*Primary Examiner* — Jose R Diaz
(74) *Attorney, Agent, or Firm* — Morgan, Lewis & Bockius LLP

(57) ABSTRACT

A disclosed display device includes a first oxide semiconductor layer and an oxide semiconductor connection wire both formed from an oxide semiconductor material layer over a substrate. The oxide semiconductor connection wire is integrally connected to the first oxide semiconductor layer and has a lower sheet resistance than the first oxide semiconductor layer. The display device also includes a first gate electrode either over the first oxide semiconductor layer or between the first oxide semiconductor layer and the substrate. The display device further includes a first gate insulation layer between the first oxide semiconductor layer and the first gate electrode.

16 Claims, 16 Drawing Sheets

(51) Int. Cl.
    *H01L 29/24*     (2006.01)
    *H01L 29/66*     (2006.01)
    *H01L 27/32*     (2006.01)

(52) U.S. Cl.
    CPC ........ *H01L 29/24* (2013.01); *H01L 29/66969* (2013.01); *H01L 29/7869* (2013.01); *H01L 29/78696* (2013.01); *H01L 27/3262* (2013.01)

(56) References Cited

U.S. PATENT DOCUMENTS

| | | |
|---|---|---|
| 6,469,318 B2 | 10/2002 | Yamada et al. |
| 8,373,237 B2 | 2/2013 | Park et al. |
| 9,053,994 B2 | 6/2015 | Yamada et al. |
| 9,368,525 B2 | 6/2016 | Morosawa |
| 9,608,009 B2 * | 3/2017 | Park .................... H01L 27/124 |
| 2001/0015626 A1 | 8/2001 | Ozawa |
| 2002/0070381 A1 | 6/2002 | Yamada et al. |
| 2003/0066740 A1 | 4/2003 | Inukai |
| 2011/0127537 A1 | 6/2011 | Matsumuro |
| 2012/0249915 A1 | 10/2012 | Morosawa |
| 2012/0299116 A1 | 11/2012 | Takeuchi et al. |
| 2014/0070181 A1 | 3/2014 | Zhang |

FOREIGN PATENT DOCUMENTS

| | | |
|---|---|---|
| CN | 102655155 A | 9/2012 |
| CN | 102866553 A | 1/2013 |
| CN | 102929062 A | 2/2013 |
| KR | 100209620 B1 | 7/1999 |
| KR | 20120112050 A | 10/2012 |

OTHER PUBLICATIONS

Korean Office Action dated Dec. 15, 2016 for the related Korean Patent Application No. 10-2013-0119252.

* cited by examiner

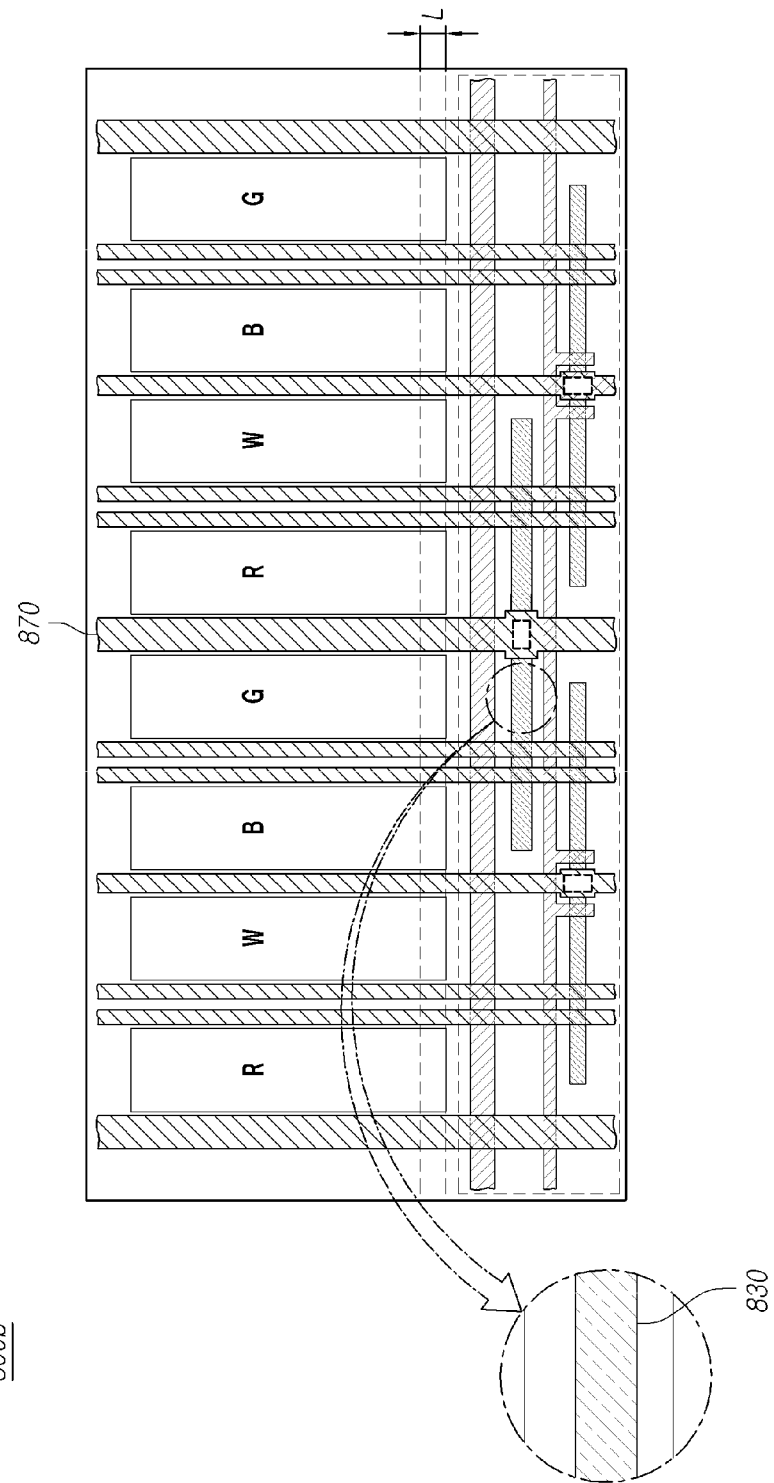

DISPLAY DEVICE

This application is a Continuation application of U.S. patent application Ser. No. 14/506,812, filed on Oct. 6, 2014, and also claims priority from and the benefit under 35 U.S.C. § 119(a) of Korean Patent Application No. 10-2013-0119252, filed in Korea on Oct. 7, 2013. Each of the above prior applications is hereby incorporated by reference for all purposes as if fully set forth herein.

BACKGROUND OF THE INVENTION

Field of the Invention

The present invention relates to a display device including wires and transistors, and to a method of fabricating the same.

Discussion of the Related Art

Recently, the society at large has been progressing towards an authentic information age, and the display technology for processing and displaying a large amount of information has been developing rapidly. In particular, such display devices as liquid crystal display devices, organic light emitting devices, and electrophoretic display devices, which exhibit excellent performance through their thin profile, light weight, and low power consumption characteristics, have been developed and are replacing the conventional Cathode Ray Tubes (CRTs).

The display devices described above include an array substrate having various wires and transistors. The array substrate used in the display devices has a structure that employs different kinds of wires electrically connected through contact holes in regions in which a plurality of signal wires cross one another. However, the contact holes formed in this case cause a reduction in the aperture ratio of the display device.

SUMMARY OF THE INVENTION

Accordingly, the present invention is directed to a display device and a method for fabricating the same that substantially obviate one or more of the problems due to limitations and disadvantages of the related art.

An object of the present invention is to provide a display device and a method of fabricating the same capable of removing a contact hole of a signal wire that causes a reduction in the aperture ratio, thereby increasing the aperture ratio of the display device.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the display device in accordance with an aspect of the present invention includes: a first oxide semiconductor layer over a substrate, the first oxide semiconductor layer being a first portion of an oxide semiconductor material layer over the substrate; an oxide semiconductor connection wire over the substrate, wherein the oxide semiconductor connection wire is formed from a second portion of the oxide semiconductor material layer, is integrally connected to the first oxide semiconductor layer, and has a lower sheet resistance than the first oxide semiconductor layer; a first gate electrode either over the first oxide semiconductor layer or between the first oxide semiconductor layer and the substrate; and a first gate insulation layer between the first oxide semiconductor layer and the first gate electrode.

In accordance with another aspect of the present invention, a method of fabricating a display device includes: forming an oxide semiconductor material layer over a substrate; sequentially forming a first gate insulation layer and a first gate electrode over a first portion of the oxide semiconductor material layer, the first portion of the oxide semiconductor material layer being a first oxide semiconductor layer; and treating a second portion of the oxide semiconductor material layer to form an oxide semiconductor connection wire, the oxide semiconductor connection wire being integrally connected to the first oxide semiconductor layer, wherein the oxide semiconductor connection wire has a lower sheet resistance than the first oxide semiconductor layer.

In accordance with still another aspect of the present invention, a display device includes: an oxide semiconductor connection wire over a substrate, the oxide semiconductor connection wire being formed from an oxide semiconductor material layer and having resistance characteristics of a conductor; a first interlayer insulating layer; a first conductive layer connected to the oxide semiconductor connection wire through a first contact hole in the first interlayer insulating layer; a second interlayer insulating layer; and a second conductive layer connected to the oxide semiconductor connection wire through a second contact hole in the first interlayer insulating layer and the second interlayer insulating layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate example embodiments of the invention and together with the description serve to explain the principles of the invention. In the drawings:

FIG. 8B is a plan view of an organic light emitting display device in accordance with an example embodiment of the present invention.

DETAILED DESCRIPTION OF THE EXAMPLE EMBODIMENTS

Figure 1:
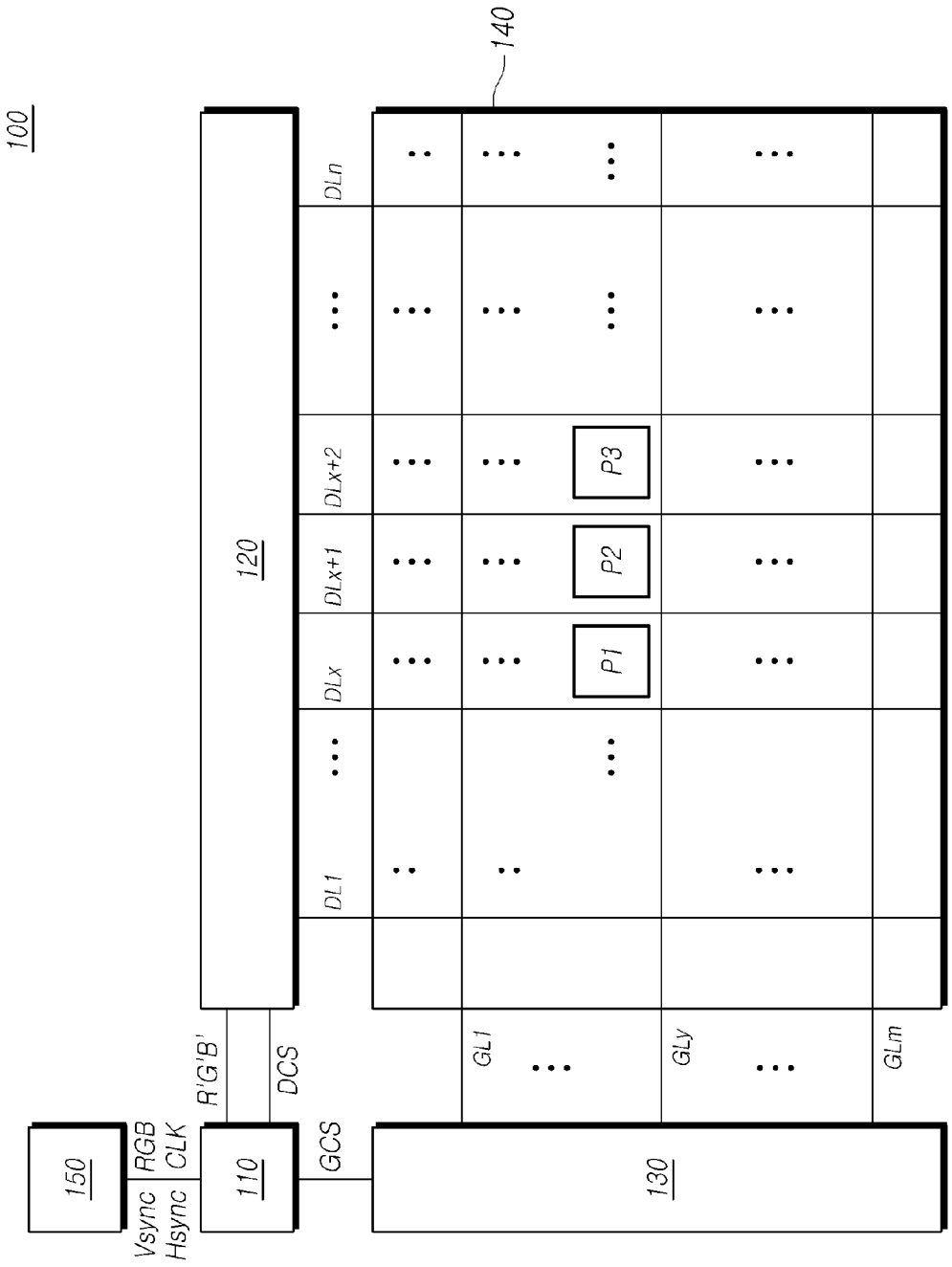
FIG. 1 is a configuration diagram of an organic light emitting display device to which example embodiments are applied.

Reference will now be made in detail to the example embodiments of the present invention, which are illustrated in the accompanying drawings. In the following description, the same elements will be designated by the same reference numerals although they are shown in different drawings.

In addition, terms, such as first, second, A, B, (a), (b), or the like may be used herein when describing components of the present invention. Each of these terminologies is not used to define an essence, order, or sequence of a corresponding component but used merely to distinguish the corresponding component from other component(s). It should also be noted that if it is described in the specification that a first component is "connected," "coupled" or "joined" to a second component, the first component may be connected, coupled or joined to the second component directly or through a third component between the first and second components, unless otherwise specified.

FIG. 1 is a configuration diagram of a liquid crystal display device or an organic light emitting display device to which the example embodiments are applied. While the example embodiments of the present invention are disclosed in the context of an organic light emitting display device, the present invention is not limited in application to the organic light emitting display device. The present invention similarly applies to other display devices which employ a plurality of signal wires connected to one another in various ways.

As shown in FIG. 1, a display device 100 includes a panel 140 having gate lines GL1 to GLn and data lines DL1 to DLm formed thereon and crossing one another. The display device 100 also includes such components as a gate driver 130 for driving the gate lines GL1 to GLn, a data driver 120 for driving the data lines DL1 to DLm, and a timing controller 110 for controlling driving timing of the data driver 120.

In the panel 140, each pixel P is defined by the gate lines GL1 to GLn and data lines DL1 to DLm crossing each other.

Examples of the display device 100 shown in FIG. 1 include a liquid crystal display (LCD) and an Organic Light-Emitting Display (OLED) device, but the display device 100 is not limited to those specific examples. The display device 100, for example, may be any type of display device in accordance with the first to fourth example embodiments which will be described later. For example, the display device 100 described above may be the organic light-emitting device including a plurality of organic light-emitting diodes (OLED) or may be the organic light-emitting device which can be fabricated by one of the example fabricating methods disclosed herein.

Hereinafter, the display device in accordance with the first to fourth example embodiments will be described in detail with reference to the accompanying drawings.

First Example Embodiment

Figure 2:
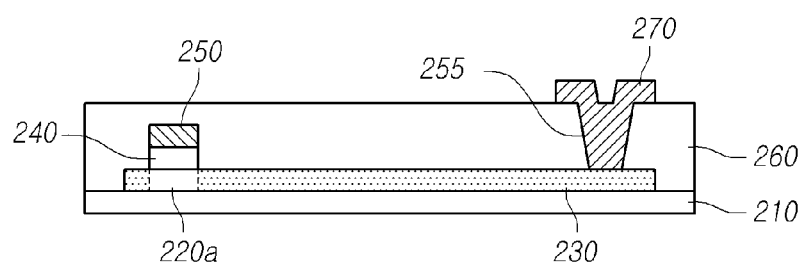
FIG. 2 is a schematic cross sectional view of a display device in accordance with a first example embodiment of the present invention.

FIG. 2 is a schematic cross sectional view of a display device in accordance with a first example embodiment of the present invention.

As shown in FIG. 2, an oxide semiconductor layer 220a and an oxide semiconductor connection wire 230 are formed on a substrate 210 which may be made of glass, plastic, or another suitable material. The oxide semiconductor layer 220a is connected to the oxide semiconductor connection wire 230 to be integrally formed.

The oxide semiconductor layer 220a and the oxide semiconductor connection wire 230 are made of an oxide semiconductor material. The oxide semiconductor material may be a zinc-oxide-based material or an oxide semiconductor material including indium. For example, the oxide semiconductor material may be IGZO (Indium Gallium Zinc Oxide), ZTO (Zinc Tin Oxide), ZIO (Zinc Indium Oxide), or another material with semiconductive characteristics. Further, the oxide semiconductor connection wire 230 may be formed from the same layer as the oxide semiconductor layer 220a. When the oxide semiconductor connection wire 230 is exposed to plasma or impurities are added thereto, conductivity thereof may be enhanced.

The oxide semiconductor layer 220a has characteristics of a semiconductor, and the oxide semiconductor connection wire 230 has characteristics of a conductor. For example, the sheet resistance of the oxide semiconductor layer 220a may be as high as about $10^{12} \Omega/\square$, while the sheet resistance of the oxide semiconductor connection wire 230 may be equal to or less than about 1.3 k$\Omega/\square$. However, the present invention is not limited to these ranges.

A gate insulation layer 240 is formed on the oxide semiconductor layer 220a, and a gate metal 250 corresponding to the oxide semiconductor layer 220a is formed on the gate insulation layer 240.

The gate insulation layer 240 may be formed of insulation materials, examples of which include inorganic insulation materials like silicon nitride ($SiN_X$) and silicon oxide ($SiO_X$) and organic insulation materials like benzo-cyclo-butene (BCB) and an acrylic-based resin.

The gate metal 250 may be formed of a conductive metal and an alloy thereof without being limited thereto. For example, the gate metal 250 may include one or more of the following materials: copper (Cu), copper alloy, aluminum (Al), aluminum alloy (AlNd), magnesium (Mg), magnesium alloy, titanium (Ti), tungsten (W), molybdenum (Mo), molybdenum alloy (MoTi) and any alloy thereof. Further, the gate metal 250 may be formed of a single layer or multiple layers.

The interlayer insulating layer 260 is formed on the entire surface of the substrate 210 including the gate metal 250. In this case, the interlayer insulating layer 260 has a contact hole 255 to expose a part of the oxide semiconductor connection wire 230.

The interlayer insulating layer 260 may be formed of an insulation material, examples of which include such inorganic insulation materials as silicon nitride ($SiN_X$) and silicon oxide ($SiO_X$), and such organic insulation materials as benzo-cyclo-butene (BCB) and acrylic-based resin.

A wire 270 connected to the oxide semiconductor connection wire 230 through the contact hole 255 is formed on the interlayer insulating layer 260. The wire 270 may be a signal wire or an electrode. More specifically, the signal wire may be any type of wire which is used in a display panel, such as a gate wire, a data wire, a power wire and a common wire. Further, the electrode may be any type of electrode used in a display panel, such as a cathode, an anode, a pixel electrode, or a common electrode.

The wire 270 may be formed of conductive metal and an alloy thereof, to which the present invention is not limited. For example, the wire 270 may include one or more of the following materials: copper (Cu), copper alloy, aluminum (Al), aluminum alloy (AlNd), magnesium (Mg), magnesium alloy, titanium (Ti), tungsten (W), molybdenum (Mo), molybdenum alloy (MoTi) and any alloy thereof. Further, the wire 270 may be formed of a single layer or multiple layers.

Hereinafter, a method of fabricating the display device in accordance with the first example embodiment will be described in detail with reference to FIGS. 3A to 3D.

FIGS. 3A to 3D are cross sectional views describing processes of fabricating the display device shown in FIG. 2.

Figure 3A:
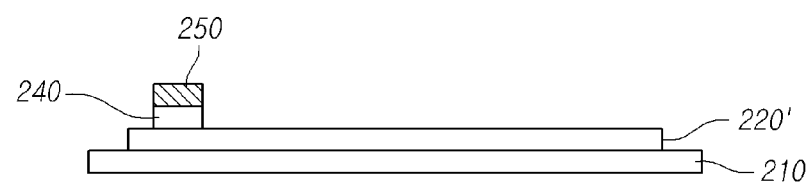
FIGS. 3A to 3D are cross sectional views describing a process of fabricating the display device shown in FIG. 2.

As shown in FIG. 3A, an oxide semiconductor material layer 220' is formed on the substrate 210, which may be made of glass, plastic, or another suitable material. In this case, the oxide semiconductor material may be a zinc-oxide-based material or an oxide semiconductor material including the indium. For example, the oxide semiconductor material may be IGZO (Indium Gallium Zinc Oxide), ZTO (Zinc Tin Oxide), ZIO (Zinc Indium Oxide), or another material with semiconductive characteristics. When a portion of the oxide semiconductor material is exposed to plasma having an atmosphere of an inert gas such as helium (He) or argon (Ar), or when impurities are added thereto, conductivity of the exposed portion of the oxide semiconductor material may be enhanced.

The oxide semiconductor material layer 220' may be formed in a shape of an island by applying the oxide semiconductor material to the entire surface of the substrate 210, and then performing a mask process, including such unit operations as applying a photoresist, photo exposure, developing, and etching, to pattern the oxide semiconductor material. In this case, the conductivity may be differently set according to the specific component ratio of the oxide semiconductor material used. For example, if the ratio of In among the materials of In, Ga and Zn, which constitute the IGZO, is raised, the conductivity of the IGZO can be improved.

Thereafter, the gate insulation layer 240 and the gate metal 250 are formed on the oxide semiconductor material layer 220'.

In this case, the method of forming the gate insulation layer 240 and the gate metal 250 may be as follows. First, a gate insulation material and a gate metal material are sequentially deposited on the whole surface of the oxide semiconductor material layer 220'. Then, the deposited materials may be patterned by a photoresist process to form the gate insulation layer 240 and the gate metal 250 on the oxide semiconductor material layer 220'

The gate insulation layer 240 may be formed of insulation materials, examples of which include such inorganic insulation materials as the silicon nitride ($SiN_x$) and the silicon oxide ($SiO_x$), and such organic insulation materials as the benzo-cyclo-butene (BCB) and acrylic-based resin.

Further, the gate metal 250 may be formed of one or more layers of conductive materials. For example, the gate metal 250 may include one or more of the following: copper (Cu), copper alloy, aluminum (Al), aluminum alloy (AlNd), magnesium (Mg), magnesium alloy, titanium (Ti), tungsten (W), molybdenum (Mo), molybdenum alloy (MoTi), and any alloy thereof.

Figure 3B:
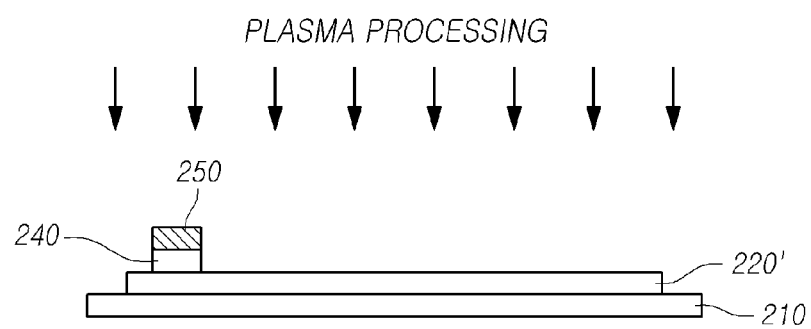

Thereafter, as shown in FIG. 3B, a plasma processing is performed on the oxide semiconductor material layer 220'.

In a plasma processing method, the plasma processing may be performed with an inert gas, such as helium (He) or argon (Ar), to damage chemical bonds on the surface of the oxide semiconductor material layer 220' so as to improve the conductivity of the portion of the layer exposed to the plasma processing.

In this case, the plasma processing is performed on the oxide semiconductor material layer 220', except for the region covered by the gate insulation layer 240 and the gate metal 250.

The region of the oxide semiconductor material layer 220' subjected to the plasma processing has a high carrier density on the level of a conductor and a lower resistance, so as to have an enhanced conductivity. Further, the resistance of the region subjected to the plasma processing is reduced so that the conductivity of that region of the oxide semiconductor material layer 220' can be improved.

Figure 3C:
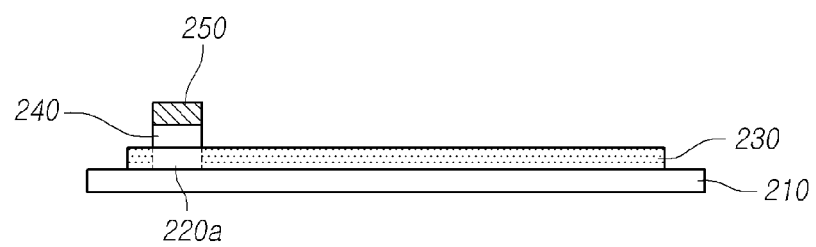

As shown in FIG. 3C, after the plasma processing is performed, the region of the oxide semiconductor material layer 220' covered by the gate insulation layer 240 and the gate metal 250 as shown in FIG. 3B, and thus not subject to the plasma processing, becomes the oxide semiconductor layer 220a. On the other hand, the region of the oxide semiconductor material layer 220' not covered by the gate insulation layer 240 and the gate metal 250, thus subject to the plasma processing, becomes the oxide semiconductor connection wire 230.

As described above, the oxide semiconductor layer 220a is the oxide semiconductor material layer on which the plasma processing is not performed, and the sheet resistance thereof may be as high as about $10^{12} \Omega/\square$.

On the other hand, the sheet resistance of the oxide semiconductor connection wire 230 subjected to the plasma processing may be equal to or less than about 1.3 k$\Omega/\square$. That is, after the plasma processing is performed on the particular region of the oxide semiconductor material layer 220' as shown in FIG. 3B, the sheet resistance of that region is greatly reduced, and the conductivity is improved up to the level of a conductor.

Accordingly, since the sheet resistance of the oxide semiconductor connection wire 230 subjected to the plasma processing is much smaller than that of the oxide semiconductor layer 220a, the oxide semiconductor connection wire 230 may be used as a conductive wire.

As described above, the oxide semiconductor material may be exposed to plasma having an atmosphere of a specific gas such as an inert gas, so as to be provided with an enhanced conductivity. But, the present invention is not limited thereto. For example, as an alternative, conductive or semiconductive impurities may be added to a region of the oxide semiconductor material to improve the conductivity of that region of the oxide semiconductor material. When the conductive or semiconductive impurities are added to the oxide semiconductor material, the same process as that for ion-doping the source and drain regions of a silicon semiconductor layer to form an ohmic contact layer may be used.

Figure 3D:
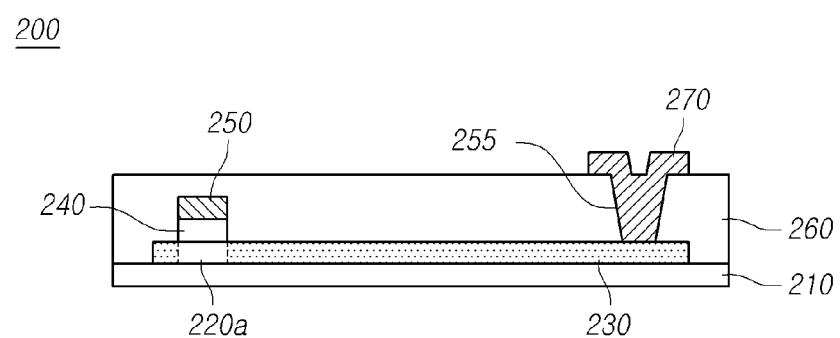

Next, as shown in FIG. 3D, an interlayer insulating layer 260 may be formed on an entire surface of the substrate 210 that has been subjected to the plasma processing. Here, the interlayer insulating layer 260 may be formed of insulation materials, examples of which include such inorganic insulation materials as the silicon nitride ($SiN_x$) and the silicon oxide ($SiO_x$), and such organic insulation materials as the benzo-cyclo-butene (BCB) and acrylic-based resin. Then, a patterning is performed by a mask process to form a contact hole 255. In this case, a part of the oxide semiconductor connection wire 230 is exposed through the contact hole 255.

Thereafter, the wire 270 is formed to connect to the oxide semiconductor connection wire 230 through the contact hole 255. Here, the wire 270 may be a signal wire, an electrode, or any other conductive component in a display device. For example, the signal wire 270 may be any type of wire which is used in a display panel, such as a gate wire, a data wire, a power wire or a common wire, or any type of electrode in a display device, such as a cathode, an anode, a pixel electrode, or a common electrode.

The wire 270 may be formed of one or more layers of conductive metal or an alloy thereof without being limited thereto. For example, the wire 270 may include one or more of the following: copper (Cu), copper alloy, aluminum (Al), aluminum alloy (AlNd), magnesium (Mg), magnesium alloy, titanium (Ti), tungsten (W), molybdenum (Mo), molybdenum alloy (MoTi), and any alloy thereof. Further, the wire 270 may be formed of a single layer or multiple layers.

With the example configuration described above, the display device 200 in accordance with the first example embodiment of the present invention may have a transistor having the conductive metal 250 and the oxide semiconductor layer 220a, and the wire 270 electrically connected to the oxide semiconductor connection wire 230. The example embodiment is described in the context of a display device having a top gate transistor; however, a bottom gate transistor structure may alternatively be employed without departing from the spirit or scope of the present invention.

As described above, in accordance with an example embodiment of the present invention, it is possible to integrally form the oxide semiconductor layer 220a and the oxide semiconductor connection wire 230 by patterning them at the same time from the same oxide semiconductor material layer 220' by performing the plasma processing on, or by adding impurities to, a region of the oxide semiconductor material layer 220' to turn the region into the oxide semiconductor connection wire 230. Therefore, a more complex conventional wire forming process using separate layers is not necessary, and it is possible to reduce the number of processing steps for forming contact holes to electrically connect a plurality of wires.

Therefore, the display device in accordance with the first example embodiment of the present invention may have an enhanced aperture ratio due to a reduced number of contact holes. This may also result in improving the life span of the display device and lowering its power consumption.

Second Example Embodiment

Hereinafter, the display device in accordance with the second example embodiment of the present invention will be described in detail with reference to FIGS. 4 to 5D.

Figure 4:
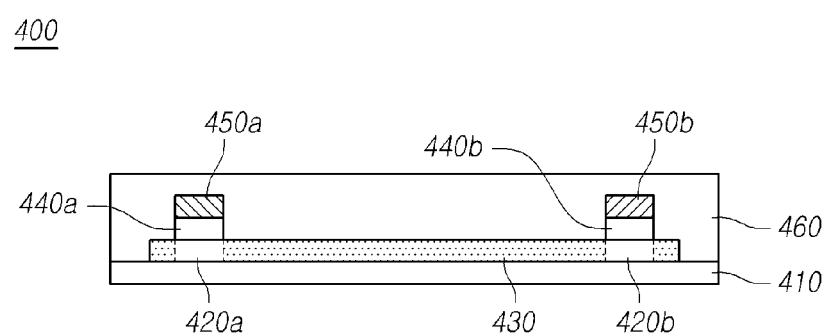
FIG. 4 is a schematic cross sectional view of a display device in accordance with a second example embodiment of the present invention.

FIG. 4 is a schematic cross sectional view of the display device in accordance with the second example embodiment of the present invention. FIG. 4 shows a connection between two transistors.

As shown in FIG. 4, a first oxide semiconductor layer 420a, an oxide semiconductor connection wire 430, and a second oxide semiconductor layer 420b, which are connected to one another, may be integrally formed.

The first oxide semiconductor layer 420a, the second oxide semiconductor layer 420b, and the oxide semiconductor connection wire 430 are made of an oxide semiconductor material. As in the above first example embodiment, the oxide semiconductor material may be a zinc-oxide-based material or an oxide semiconductor material including indium. For example, the oxide semiconductor material may be IGZO (Indium Gallium Zinc Oxide), ZTO (Zinc Tin Oxide), ZIO (Zinc Indium Oxide), or another material with semiconductive characteristics.

The first oxide semiconductor layer 420a and the second oxide semiconductor layer 420b have characteristics of a semiconductor, and the oxide semiconductor connection wire 430 has the characteristics of a conductor. In this case, the sheet resistance of each of the first oxide semiconductor layer 420a and the second oxide semiconductor layer 420b may be up to about $10^{12} \Omega/\square$. On the other hand, the sheet resistance of the oxide semiconductor connection wire 430 may be equal to or less than about 1.3 k$\Omega/\square$.

A first gate insulation layer 440a and a second gate insulation layer 440b are concurrently formed on the first and second oxide semiconductor layers 420a and 420b, respectively. Then, a first gate metal 450a and a second gate metal 450b are concurrently formed on the first and second gate insulation layers 440a and 440b, respectively.

Here, the first gate insulation layer 440a and the second gate insulation layer 440b each may be formed of insulation materials, examples of which include such inorganic insulation materials as the silicon nitride ($SiN_x$) and the silicon oxide ($SiO_x$), and such organic insulation materials as the benzo-cyclo-butene (BCB) and acrylic-based resin.

Further, the first gate metal 450a and the second gate metal 450b each may be formed of conductive metal and an alloy thereof without being limited thereto. For example, the first gate metal 450a and the second gate metal 450b each may include one or more of the following materials: copper (Cu), copper alloy, aluminum (Al), aluminum alloy (AlNd), magnesium (Mg), magnesium alloy, titanium (Ti), tungsten (W), molybdenum (Mo), molybdenum alloy (MoTi) and any alloy thereof. Further, the first gate metal 450a and the second gate metal 450b each may be formed in a single layer or multiple layers.

An interlayer insulating layer 460 is formed on the surface of a substrate 410 including the first gate metal 450a and the second gate metal 450b. The interlayer insulating layer 460 may be formed of insulation materials, examples of which include such inorganic insulation material as the silicon nitride ($SiN_x$) and the silicon oxide ($SiO_x$), and such organic insulation material as the benzo-cyclo-butene (BCB) and acrylic-based resin.

Hereinafter, the processes of fabricating the display device in accordance with the second example embodiment of the present invention will be described in detail with reference to the accompanying drawings. Although this example embodiment is described in the context of a display device having top gate transistors, the display device may employ transistors with a bottom gate structure without departing from the spirit or scope of the present invention.

FIGS. 5A to 5D are cross sectional views describing a process of fabricating the display device in accordance with the second embodiment of the present invention.

Figure 5A:
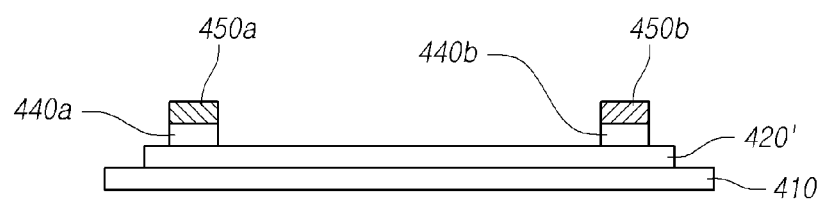
FIGS. 5A to 5D are cross sectional views describing a process of fabricating the display device shown in FIG. 4.

As shown in FIG. 5A, an oxide semiconductor material layer 420' is formed on the substrate 410 which may made of glass, plastic, or another suitable material. In this case, the oxide semiconductor material may be a zinc-oxide-based material or a oxide semiconductor material including the indium. For example, the oxide semiconductor material may be IGZO (Indium Gallium Zinc Oxide), ZTO (Zinc Tin Oxide), ZIO (Zinc Indium Oxide), or another material with semiconductive characteristics. When the oxide semiconductor material is exposed to plasma having an atmosphere of an inert gas, such as helium (He) or argon (Ar), or when impurities are added thereto, the conductivity of the exposed portion of the oxide semiconductor material may be enhanced.

In this case, the oxide semiconductor material layer 420' may be formed in a shape of an island by applying the oxide semiconductor material to the entire surface of the substrate 410, and then performing a mask process, including such unit operations as applying a photoresist, photo exposure, developing, and etching, to pattern the oxide semiconductor material. In this case, the conductivity may be differently set according to the specific component ratio of the oxide semiconductor material used. For example, if the ratio of In among the material of In, Ga and Zn, which constitute the IGZO, is raised, the conductivity of the IGZO can be improved.

Thereafter, the first gate insulation layer 440a, the second gate insulation layer 440b, the first gate metal 450a, and the second gate metal 450b are formed on the oxide semiconductor material layer 420'.

First, a gate insulation material layer and a gate metal material layer are sequentially deposited on the oxide semiconductor material layer 420'. Then, the deposited layers may be patterned by a photoresist process to form the first gate insulation layer 440a, the second gate insulation layer 440b, the first gate metal 450a, and the second gate metal 450b over the oxide semiconductor material layer 420'.

In this case, the first gate insulation layer 440a and the first gate metal 450a are patterned together with a single mask, and the second gate insulation layer 440b and the second gate metal 450b are patterned together with a single mask. The first and second gate insulation layers 440a and 440b, and the first and second gate metals 450a and 450b may all be patterned together with a single mask.

Here, the first gate metal 450a and the second gate metal 450b are formed to be spaced apart from each other.

Further, the first gate metal 450a and the second gate metal 450b each may be formed of one or more layers of conductive metal or an alloy thereof without being limited thereto. For example, the first gate metal 450a and the second gate metal 450b each may include one or more of the following: copper (Cu), copper alloy, aluminum (Al), aluminum alloy (AlNd), magnesium (Mg), magnesium alloy, titanium (Ti), tungsten (W), molybdenum (Mo), molybdenum alloy (MoTi) and any alloy thereof. Further, the first gate metal 450a and the second gate metal 450b each may be formed of a single layer or multiple layers.

Figure 5B:
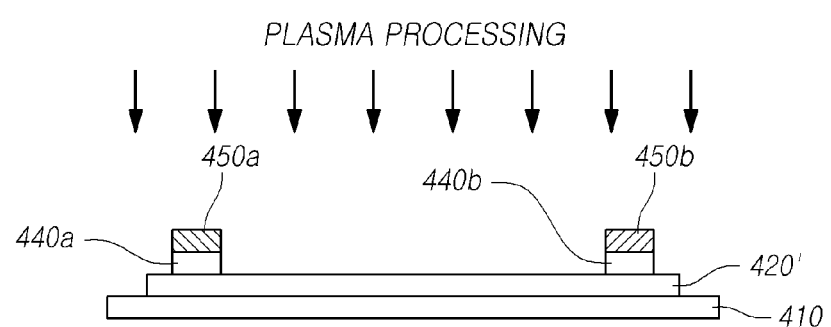

As shown in FIG. 5B, a plasma processing is then performed on the oxide semiconductor material layer 420', on which the first gate insulation layer 440a, the second gate insulation layer 440b, the first gate metal 450a, and the second gate metal 450b are formed.

In the plasma processing method, the plasma processing may be performed with an inert gas, such as helium (He) or argon (Ar), to damage the chemical bond at the surface of the oxide semiconductor material layer 420' so as to improve the conductivity of the portion of the layer exposed to the plasma processing.

Here, the plasma processing is performed on the exposed regions of the oxide semiconductor material layer 420' on which the first gate metal 450a and the second gate metal 450b are not formed.

The regions of the oxide semiconductor material layer 420' subjected to the plasma processing have a high carrier density on the level of a conductor and a lower resistance so as to have an enhanced conductivity. Consequently, the conductivity of the exposed regions of the oxide semiconductor material layer 420' may be improved by the plasma processing.

Figure 5C:
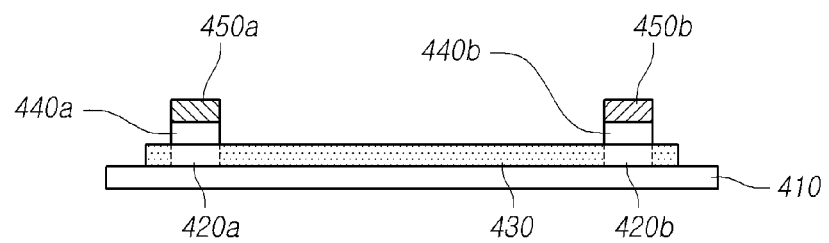

As shown in FIG. 5C, after the plasma processing, the regions of the oxide semiconductor material layer 420' covered by the first gate metal 450a and the second gate metal 450b, and thus not subject to the plasma processing, become the first oxide semiconductor layer 420a and the second oxide semiconductor layer 420b, respectively. On the other hand, the region of the oxide semiconductor layer 420' not covered by the first gate metal 450a or the second gate metal 450b, thus subjected to the plasma processing, becomes an oxide semiconductor connection wire 430.

In this case, the oxide semiconductor connection wire 430 has characteristics of a conductor due to the plasma processing. On the other hand, the first oxide semiconductor layer 420a and the second oxide semiconductor layer 420b, on which the plasma processing is not performed because they are respectively covered by the first gate metal 450a and the second gate metal 450b, still have characteristics of a semiconductor.

The sheet resistance of each of the first oxide semiconductor layer 420a and the second oxide semiconductor layer 420b that have the characteristics of the semiconductor may be as high as about $10^{12} \Omega/\square$.

On the other hand, the sheet resistance of the oxide semiconductor connection wire 430 after the plasma processing may be equal to or less than about 1.3 k$\Omega/\square$. In other words, after the plasma processing is performed on the particular regions of the oxide semiconductor material layer 420' as shown in FIG. 5B, the sheet resistance of those regions is greatly reduced, thus the conductivity is improved up to the level of a conductor. Accordingly, since the sheet resistance of the oxide semiconductor connection wire 430 subjected to the plasma processing is much smaller than that of the first oxide semiconductor layer 420a or the second oxide semiconductor layer 420b, the oxide semiconductor connection wire 430 may be used as a conductive wire.

As described above, the oxide semiconductor material may be exposed to plasma having an atmosphere of a specific gas, such as an inert gas, so as to be provided with an enhanced conductivity. But, the present invention is not limited thereto. For example, as an alternative, conductive or semiconductive impurities may be added to regions of the oxide semiconductor material so as to improve the conductivity of those regions of the oxide semiconductor material. When the conductive or semiconductive impurities are added to the oxide semiconductor material, the same process as that for ion-doping the source and drain regions of a silicon semiconductor layer to form an ohmic contact layer may be used.

Figure 5D:
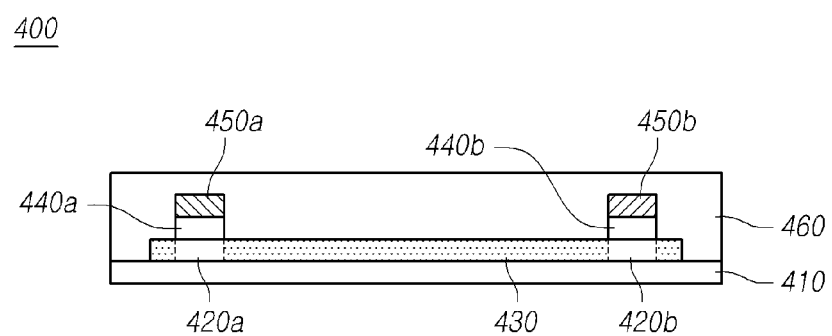

Next, as shown in FIG. 5D, an interlayer insulating layer 460 may be formed on the entire surface of the substrate 410 that had been subjected to the plasma processing. Here, the interlayer insulating layer 460 may be formed of insulation materials, examples of which include such inorganic insulation materials as the silicon nitride ($SiN_x$) and the silicon oxide ($SiO_x$), and such organic insulation materials as the benzo-cyclo-butene (BCB) and acrylic-based resin. With the example configuration described above, the display device 400 in accordance with the second embodiment of the present invention may be fabricated.

Third Example Embodiment

Figure 6A:
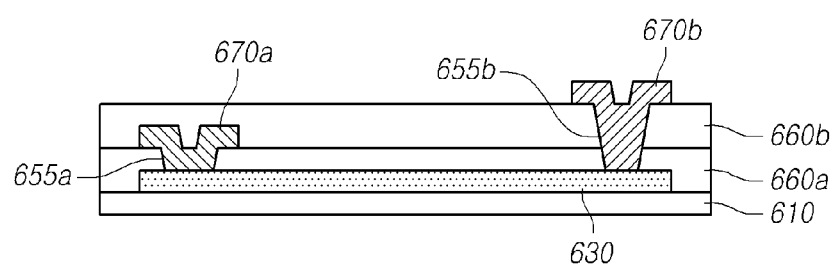
FIG. 6A is a schematic cross sectional view of a display device in accordance with a third example embodiment of the present invention.

FIG. 6A is a schematic cross sectional view of a display device in accordance with a third example embodiment of the present invention.

As shown in FIG. 6A, an oxide semiconductor connection wire 630 formed of an oxide semiconductor material is formed on the substrate 610 which may be made of glass, plastic, or another suitable material. In this case, the oxide semiconductor material may be a zinc-oxide-based material or an oxide semiconductor material including the indium. For example, the oxide semiconductor material may be IGZO (Indium Gallium Zinc Oxide), ZTO (Zinc Tin Oxide), ZIO (Zinc Indium Oxide), or another material with semiconductive characteristics.

The oxide semiconductor connection wire 630 may be plasma processed with an inert gas, such as helium (He) or argon (Ar), to have its conductivity enhanced. Alternatively, the oxide semiconductor connection wire 630 may have impurities injected therein to have its conductivity enhanced. The sheet resistance of the oxide semiconductor connection wire 630 may be equal to or less than about 1.3 k$\Omega$/□ such that it can serve as a conductive wire.

Further, a first interlayer insulating layer 660a may be formed on the oxide semiconductor connection wire 630.

The first interlayer insulating layer 660a includes a first contact hole 655a and a second contact hole 655b through which parts of the oxide semiconductor connection wire 630 are exposed.

Further, a first wire 670a connected to the oxide semiconductor connection wire 630 through a first contact hole 655a may be formed on the first interlayer insulating layer 660a.

A second interlayer insulating layer 660b may be formed on the entire surface of the substrate 610 including the first wire 670a. In this case, the second interlayer insulating layer 660b, together with the first interlayer insulating layer 660a, includes the second contact hole 655b through which parts of the oxide semiconductor connection wire 630 are exposed.

The first interlayer insulating layer 660a and the second interlayer insulating layer 660b each may be formed of insulation materials, examples of which include such inorganic insulation materials as the silicon nitride (SiN$_X$) and the silicon oxide (SiO$_X$), and such organic insulation materials as the benzo-cyclo-butene (BCB) and acrylic-based resin.

A second wire 670b connected to the oxide semiconductor connection wire 630 through the second contact hole 655b may be formed on the second interlayer insulating layer 660b.

The first wire 670a and the second wire 670b may be signal wires, electrodes, or any conductive components used in a display panel. For example, a signal wire may be any type of wire which is used in a display panel, such as a gate wire, a data wire, a power wire and a common wire. Further, an electrode may be any type of electrode used in a display panel, such as a cathode, an anode, a pixel electrode, or a common electrode.

Further, the first wire 670a and the second wire 670b each may be formed of one or more layers of conductive metal and an alloy thereof without being limited thereto. For example, the first wire 670a and the second wire 670b each may include one or more of the following materials: copper (Cu), copper alloy, aluminum (Al), aluminum alloy (AlNd), magnesium (Mg), magnesium alloy, titanium (Ti), tungsten (W), molybdenum (Mo), molybdenum alloy (MoTi) and any alloy thereof. Further, the first wire 670a and the second wire 670b each may be formed of a single layer or multiple layers.

With the example configuration described above, the display device 600a in accordance with the third example embodiment of the present invention may be fabricated.

Fourth Example Embodiment

Figure 6B:
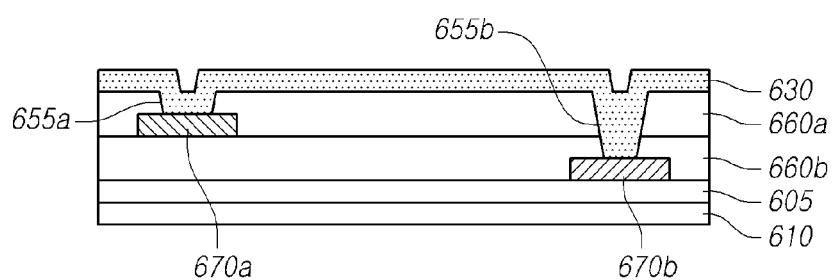
FIG. 6B is a schematic cross sectional view of a display device in accordance with a fourth example embodiment of the present invention.

FIG. 6B is a schematic cross sectional view of a display device in accordance with a fourth example embodiment of the present invention.

As shown in FIG. 6B, a buffer layer 605 may be formed on the substrate 610 which may be made of glass, plastic, or another suitable material. The buffer layer 605 may be formed of an inorganic insulation film or an organic insulation film, and serves to protect the substrate 610 from the penetration of impurities and the like. The buffer layer 605 is formed to protect from penetration of impurities and other undesirable substances, but the display device according to this example embodiment may be made without the buffer layer 605.

The second wire 670b is formed on the buffer layer 605, and the second interlayer insulating layer 660b is formed on the entire surface of the substrate 610 including the second wire 670b.

In this case, the second interlayer insulating layer 660b includes the second contact hole 655b through which a part of the second wire 670b is exposed.

The first wire 670a is formed to be spaced apart from the second wire 670b on the second interlayer insulating layer 660b.

The first interlayer insulating layer 660a is formed on the entire surface of the substrate 610, including where the first wire 670a is formed.

In this case, the first interlayer insulating layer 660a includes the first contact hole 655a through which a part of the first wire 670a is exposed. Further, the first interlayer insulating layer 660a, together with the second interlayer insulating layer 660b, includes the second contact hole 655b exposing a part of the second wire 670b.

The first interlayer insulating layer 660a and the second interlayer insulating layer 660b each may be formed of insulation materials, examples of which include such inorganic insulation materials as the silicon nitride (SiN$_X$) and the silicon oxide (SiO$_X$), and such organic insulation materials as the benzo-cyclo-butene (BCB) and acrylic-based resin.

The first wire 670a and the second wire 670b may be signal wires, electrodes, or any conductive components used on display panels. For example, a signal wire may be any type of wire used in a display panel such as a gate wire, a data wire, a power wire and a common wire. Further, an electrode may be any type of electrode used in a display panel, such as a cathode, an anode, a pixel electrode, or a common electrode.

Further, the first wire 670a and the second wire 670b each may be formed of one or more layers of conductive metal or an alloy thereof without being limited thereto. For example, the first wire 670a and the second wire 670b each may include one or more of the following materials: copper (Cu), copper alloy, aluminum (Al), aluminum alloy (AlNd), magnesium (Mg), magnesium alloy, titanium (Ti), tungsten (W), molybdenum (Mo), molybdenum alloy (MoTi) and any alloy thereof. Further, the first wire 670a and the second wire 670b each may be formed in a single layer or multiple layers.

The oxide semiconductor connection wire 630 is formed on the first interlayer insulating layer 660a. In this case, the oxide semiconductor connection wire 630 is connected to the first wire 670a through the first contact hole 655a, and is connected to the second wire 670b through the second contact hole 655b.

The oxide semiconductor connection wire 630 may be formed of an oxide semiconductor material. Here, the oxide semiconductor material may be a zinc-oxide-based material or an oxide semiconductor material including the indium. For example, the oxide semiconductor material may be IGZO (Indium Gallium Zinc Oxide), ZTO (Zinc Tin Oxide), ZIO (Zinc Indium Oxide), or another material with semiconductive characteristics.

The oxide semiconductor connection wire 630 may be plasma processed with an inert gas, such as helium (He) or argon (Ar), to have its conductivity enhanced. Alternatively, the oxide semiconductor connection wire 630 may have impurities injected therein to have its conductivity enhanced. The sheet resistance of the oxide semiconductor connection wire 630 may be equal to or less than about 1.3 k$\Omega$/□ such that it can serve as a conductive wire.

With the example configuration described above, the display device 600b in accordance with the fourth example embodiment of the present invention may be fabricated.

The above example embodiments of a display device includes an oxide semiconductor connection wire to connect an oxide semiconductor layer to a wire or an electrode, an oxide semiconductor connection wire to connect an oxide semiconductor layer to another oxide semiconductor layer, or an oxide semiconductor connection wire to connect between two wires, between two electrodes, or between a wire and an electrode.

Further, with the oxide semiconductor connection wires formed of an oxide semiconductor material, the number of contact holes to make various connections among wires, semiconductor layers, and electrodes may be reduced. This may decrease an undesirable reduction in the aperture ratio caused by the contact holes, leading to a possible increase in the life span of the display device, as well as a reduction in its power consumption.

Further, an organic light emitting display device in accordance with the example embodiments of the present invention will be described in detail with reference to FIG. 7.

Figure 7:
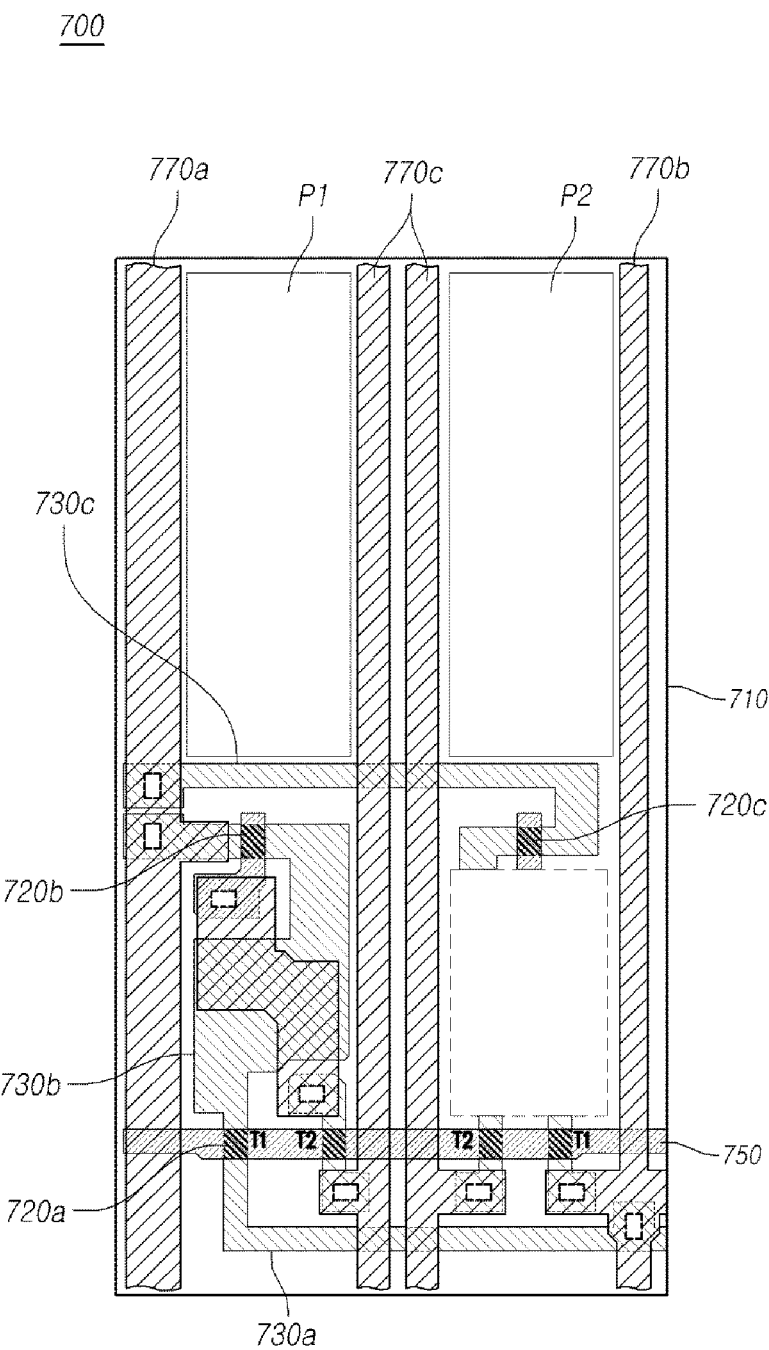
FIG. 7 is a plan view of an organic light emitting display device in accordance with the first to the fourth example embodiments.

FIG. 7 is a plan view of an organic light emitting display device in accordance with the first to the fourth example embodiments of the present invention.

As shown in FIG. 7, the organic light emitting display device 700 in accordance with the example embodiments may be the display device 100 shown in FIG. 1. A driving circuit, and light emitting areas P1 and P2 are shown in each of the two pixel areas in the organic light emitting display device 700 in accordance with the example embodiments.

The display device 700 includes on the substrate 710 a first wire 770a and a second wire 770b extending in a column direction, and a gate wire 750 extending in a row direction. The display device 700 includes the light emitting areas P1 and P2.

A first oxide semiconductor layer 720a, a second oxide semiconductor layer 720b, a third oxide semiconductor layer 720c, a first oxide semiconductor connection wire 730a, a second oxide semiconductor connection wire 730b, and a third oxide semiconductor connection wire 730c are formed on the substrate 710.

Further, one or more of separate wires may be located between the first wire 770a and the second wire 770b, and pixels may be formed between the wires. In this example, the first wire 770a may be a data wire, and the second wire 770b may be a common wire for measuring a threshold voltage of a transistor or a degradation degree of an organic light-emitting diode.

The first oxide semiconductor layer 720a, a second oxide semiconductor layer 720b, a third oxide semiconductor layer 720c, a first oxide semiconductor connection wire 730a, a second oxide semiconductor connection wire 730b, and a third oxide semiconductor connection wire 730c may each be formed of an oxide semiconductor material.

In this example, the gate wire 750 is formed on the first oxide semiconductor layer 720a, the second oxide semiconductor layer 720b and the third oxide semiconductor layer 720c. Further, the first oxide semiconductor layer 720a, the second oxide semiconductor layer 720b and the third oxide semiconductor layer 720c are connected to the gate wire 750 through a gate insulating layer (not shown).

A first oxide semiconductor connection wire 730a is formed integrally with the first oxide semiconductor layer 720a, e.g., from the same oxide semiconductor material layer, and connects the first oxide semiconductor layer 720a to the second wire 770b. The first oxide semiconductor connection wire 730a may be connected to the second wire 770b through a contact hole (not shown).

Further, the second oxide semiconductor connection wire 730b connects the first oxide semiconductor layer 720a to the second oxide semiconductor layer 720b. The second oxide semiconductor connection wire 730b may be integrally formed with the first and second oxide semiconductor layers 720a and 720b, as well as with the first oxide semiconductor connection wire 730a. In other words, each of these wires and layers may be formed from the same oxide semiconductor material layer in accordance with the example embodiments detailed above.

The third oxide semiconductor connection wire 730c may be integrally formed with the third oxide semiconductor layer 720c and connects the third oxide semiconductor layer 720c to the first wire 770a.

In this case, the third oxide semiconductor connection wire 730c may be connected to the first wire 770a through a contact hole (not shown).

The first oxide semiconductor layer 720a, the second oxide semiconductor layer 720b, and the third oxide semiconductor layer 720c have characteristics of a semiconductor, while the first oxide semiconductor connection wire 730a, the second oxide semiconductor connection wire 730b, and the third oxide semiconductor connection wire 730c have characteristics of a conductor. For example, the sheet resistance of the first oxide semiconductor layer 720a, the second oxide semiconductor layer 720b and the third oxide semiconductor layer 720c may be as high as about $10^{12}\Omega$/□, which represents the characteristics of a semiconductor.

Further, the sheet resistance of the first oxide semiconductor connection wire 730a, the second oxide semiconductor connection wire 730b, and the third oxide semiconductor connection wire 730c may be equal to or less than about 1.3 k$\Omega$/□. This is much smaller than the sheet resistance of the first oxide semiconductor layer 720a, the second oxide semiconductor layer 720b, or the third oxide semiconductor layer 720c, and represents the characteristics of a conductor.

In the organic light emitting display device in accordance with the example embodiments of the present invention, the first oxide semiconductor connection wire 730a, the second oxide semiconductor connection wire 730b, and the third oxide semiconductor connection wire 730c may be patterned from the same oxide semiconductor material layer as the first oxide semiconductor layer 720a, the second oxide semiconductor layer 720b, and the third oxide semiconductor layer 720c. Thus, it may not be necessary to form separate conductive wires and connect them to semiconductor layers to contact holes.

Since the first oxide semiconductor connection wire 730a, the second oxide semiconductor connection wire 730b, and the third oxide semiconductor connection wire 730c are integrally connected to, e.g., formed from the same oxide semiconductor layer as, the first oxide semiconductor layer 720a, the second oxide semiconductor layer 720b, and the third oxide semiconductor layer 720c, it is possible to reduce the number of contact hole to connect the signal wires or electrodes to one another.

Accordingly, it is possible to secure a larger opening area or a light emitting area in an organic light emitting display device to improve its aperture ratio.

Hereinafter, the organic light emitting display device in accordance with the example embodiments described above is compared with a related art organic light emitting display device.

Figure 8A:
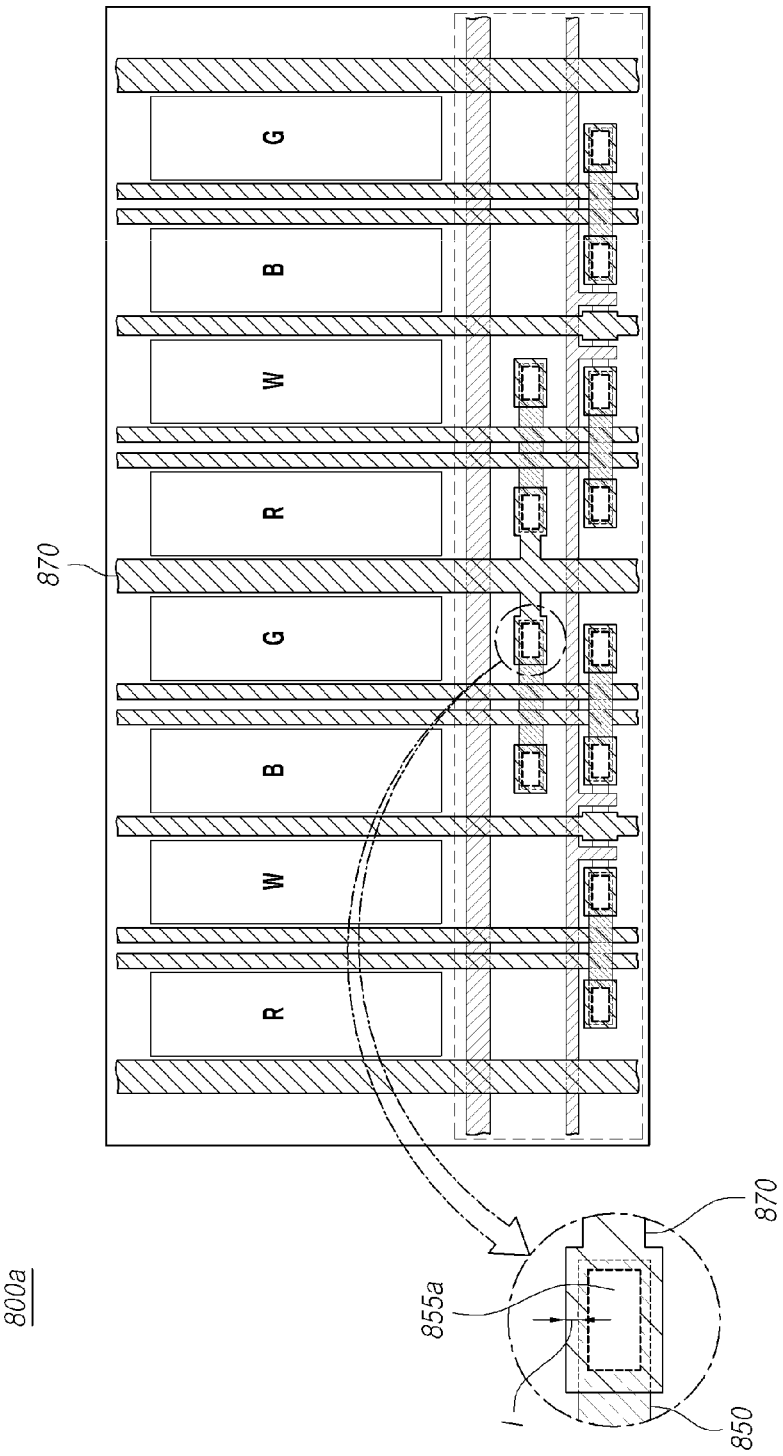
FIG. 8A is a plan view of a related art organic light emitting display device.

FIG. 8A is a plan view of a related art organic light emitting display device.

As shown in FIG. 8A, in the organic light emitting display device 800a including R,W,B,G luminous areas, a first wire 870 is connected to a second wire 850 through a contact hole 855a at the point where they overlap each other. In this case, a larger overlay margin 1 occurs in the process of forming a contact hole 855a to connect the first wire 870 to the second wire 850, resulting in a reduction in the aperture ratio.

Now, the organic light emitting display device 800b in accordance with the example embodiments of the present invention will be described.

FIG. 8B is a plan view of an organic light emitting display device in accordance with an example embodiment of the present invention. As shown in FIG. 8B, in the organic light emitting display device 800b including R,W,B,G luminous areas, an oxide semiconductor connection wire 830 is made of an oxide semiconductor material and is integrally formed from the same oxide semiconductor material layer as the oxide semiconductor layer so that the contact hole for connecting signal wires is not necessary.

Therefore, in the organic light emitting display device in accordance with the example embodiments of the present invention, some of the contact holes for connecting signal wires or electrodes may not be necessary so that the aperture ratio of the display device can be increased. For example, several of the contact holes in the related art device of FIG. 8A are made unnecessary in the example embodiments of the present invention as illustrated in FIG. 8B, thereby potentially increasing the R,W,B,G luminous areas by as much as the overlay margin 1 which occurs when forming the contact hole.

Consequently, the aperture ratio may be increased by about 20% compared to the related art organic light emitting display device. Therefore, in accordance with the present invention, it is possible to prolong the lifespan of the display device and decrease its power consumption by increasing the aperture ratio of the display device.

The organic light emitting display device in accordance with the example embodiments of the present invention is described with reference to FIGS. 7 and 8B as an example of the display device 100 shown in FIG. 1. However, the above example embodiments of the present invention are similarly applicable to, and similar improvements can be made in, a liquid crystal display (LCD) device or any other flat panel display devices.

In the foregoing, the example embodiments are described with reference to the accompanying drawings, but the present invention is not limited thereto.

In the example embodiments, the luminous material of the luminous layer included in the organic layer is represented as an organic material, but a quantum dot such as the graphene quantum dot may be included as the luminous material of the luminous layer. The organic light emitting display device in accordance with the present invention may include the display device including the quantum dot as the luminous layer.

Although example embodiments of the present invention have been described for illustrative purposes, it will be apparent to those skilled in the art that various modifications and variations can be made in the display device and method of fabricating the same of the present invention without departing from the spirit or scope of the invention. Thus, it is intended that the present invention cover the modifications and variations of this invention provided they come within the scope of the appended claims and their equivalents.

What is claimed is:

1. A display device, comprising:
    a display panel including a plurality of pixels respectively defined by a plurality of data lines and a plurality of gate lines crossing each other, and a common wire crossing the gate lines; and
    a driver to drive the data lines or the gate lines,
    wherein the display panel further includes:
        a first oxide semiconductor layer over a substrate, the first oxide semiconductor layer being a first portion of an oxide semiconductor material layer over the substrate;
        a first oxide semiconductor connection wire over the substrate, wherein the first oxide semiconductor connection wire is formed from a second portion of the oxide semiconductor material layer, is integrally connected to the first oxide semiconductor layer, and has a lower sheet resistance than the first oxide semiconductor layer;
        a first gate electrode either over the first oxide semiconductor layer or between the first oxide semiconductor layer and the substrate;
        a gate insulation layer between the first oxide semiconductor layer and the first gate electrode; and
        an interlayer insulating layer over the first oxide semiconductor connection wire and having a first contact hole above the first oxide semiconductor connection wire, and
    wherein one of the data line and a common wire is disposed on the interlayer insulating layer, overlaps the first contact hole, and is connected to the first oxide semiconductor connection wire through the first contact hole.

2. The display device of claim 1, wherein the first gate electrode substantially overlaps the first oxide semiconductor layer such that a middle portion of the first gate electrode overlaps a middle portion of the first oxide semiconductor layer.

3. The display device of claim 1, wherein the common wire extends substantially parallel to the data lines, and
    wherein the common wire directly contacts the first oxide semiconductor connection wire through the first contact hole.

4. The display device of claim 1, wherein the display panel further includes:
    a second oxide semiconductor connection wire over the substrate, wherein the second oxide semiconductor connection wire is a third portion of the oxide semiconductor material layer, is integrally connected to the first oxide semiconductor layer, and has a lower sheet resistance than the first oxide semiconductor layer;
    a second oxide semiconductor layer over the substrate, wherein the second oxide semiconductor layer is a fourth portion of the oxide semiconductor material layer, is integrally connected to the second oxide semiconductor connection wire, and has a higher sheet resistance than the first and the second oxide semiconductor connection wires; and
a second gate electrode either over the second oxide semiconductor layer or between the second oxide semiconductor layer and the substrate,
wherein the second oxide semiconductor connection wire connects the second oxide semiconductor layer to the first oxide semiconductor layer.

5. The display device of claim 4, wherein the display panel further includes:
a third oxide semiconductor connection wire over the substrate, wherein the third oxide semiconductor connection wire is a fifth portion of the oxide semiconductor material layer, is integrally connected to the second oxide semiconductor layer, and has a lower sheet resistance than the first and the second oxide semiconductor layers,
wherein the interlayer insulating layer has a second contact hole above the third oxide semiconductor connection wire, and
wherein one of the data lines is disposed on the interlayer insulating layer, overlaps with the second contact hole, and is connected to the third oxide semiconductor connection wire through the second contact hole.

6. The display device of claim 1, wherein the first oxide semiconductor connection wire is formed by either exposing the second portion of the oxide semiconductor material layer to plasma or adding impurities to the second portion of the oxide semiconductor material layer so that the first oxide semiconductor connection wire has a higher conductivity than the first oxide semiconductor layer.

7. The display device of claim 1, wherein the oxide semiconductor material layer is one of a Gallium based material and an oxide semiconductor material having Zinc.

8. A display device, comprising:
a display panel including a plurality of pixels respectively defined by a plurality of data lines and a plurality of gate lines crossing each other; and
a driver to drive the data lines or the gate lines,
wherein the display panel further includes:
a first oxide semiconductor layer over a substrate, the first oxide semiconductor layer being a first portion of an oxide semiconductor material layer over the substrate;
a first gate electrode either over the first oxide semiconductor layer or between the first oxide semiconductor layer and the substrate;
an oxide semiconductor connection wire over the substrate, wherein the oxide semiconductor connection wire is a second portion of the oxide semiconductor material layer, is integrally connected to the first oxide semiconductor layer, and has a lower sheet resistance than the first oxide semiconductor layer;
a second oxide semiconductor layer over the substrate, wherein the second oxide semiconductor layer is a third portion of the oxide semiconductor material layer, is integrally connected to the oxide semiconductor connection wire, and has a higher sheet resistance than the oxide semiconductor connection wire; and
a second gate electrode either over the second oxide semiconductor layer or between the second oxide semiconductor layer and the substrate, and
wherein one part of the oxide semiconductor connection wire connects the second oxide semiconductor layer to the first oxide semiconductor layer.

9. The display device of claim 8, wherein the oxide semiconductor connection wire is formed by either exposing the oxide semiconductor material layer to plasma or adding impurities to the oxide semiconductor material layer to increase the conductivity of the oxide semiconductor material layer.

10. The display device of claim 8, wherein the oxide semiconductor material layer is one of a Gallium based material and an oxide semiconductor material having Zinc.

11. A display device, comprising:
a display panel including a plurality of pixels respectively defined by a plurality of data lines and a plurality of gate lines crossing each other, a power wire crossing the gate lines, a cathode, and a common wire crossing the gate lines; and
a driver to drive the data lines or the gate lines,
wherein the display panel includes:
an oxide semiconductor connection wire over a substrate, the oxide semiconductor connection wire being formed from an oxide semiconductor material layer and having resistance characteristics of a conductor;
a first interlayer insulating layer;
a first conductive layer overlapping a first contact hole in the first insulating layer and connected to the oxide semiconductor connection wire through the first contact hole in the first interlayer insulating layer;
a second interlayer insulating layer; and
a second conductive layer overlapping a second contact hole in the first and the second insulating layers, and connected to the oxide semiconductor connection wire through the second contact hole in the first interlayer insulating layer and the second interlayer insulating layer,
wherein the oxide semiconductor connection wire connects the first conductive layer to the second conductive layer, and
wherein one of the first and the second conductive layers is one of the gate lines, the data lines, a pixel electrode, the cathode, and the common wire, and the other of the first and the second conductive layers is the power wire.

12. The display device of claim 11, wherein the oxide semiconductor connection wire is formed by either exposing the oxide semiconductor material layer to plasma or adding impurities to the oxide semiconductor material layer to increase the conductivity of the oxide semiconductor material layer.

13. The display device of claim 11, wherein the oxide semiconductor material layer is one of a Gallium based material and an oxide semiconductor material having Zinc.

14. The display device of claim 11, wherein the second interlayer insulating layer overlaps the first contact hole such that the first contact hole does not go through the second interlayer insulating layer.

15. The display device of claim 11, wherein the first contact hole overlaps the oxide semiconductor connection wire, and
wherein the first conductive layer directly contacts the oxide semiconductor connection wire through the first contact hole.

16. The display device of claim 15, wherein the second contact hole overlaps the oxide semiconductor connection wire, and wherein the second conductive layer directly contacts the oxide semiconductor connection wire through the first contact hole.

\* \* \* \* \*